United States Patent [19]
Uchida

[11] Patent Number: 5,901,165
[45] Date of Patent: May 4, 1999

[54] SEMICONDUCTOR LASER WITH LATTICE MISMATCH

[75] Inventor: Toru Uchida, Kawasaki, Japan

[73] Assignee: Fujitsu Limited, Kanagawa, Japan

[21] Appl. No.: 09/030,889

[22] Filed: Feb. 26, 1998

Related U.S. Application Data

[62] Division of application No. 08/681,336, Jul. 23, 1996, Pat. No. 5,751,753.

[30] Foreign Application Priority Data

Jul. 24, 1995 [JP] Japan .................................. 7-186735
Dec. 22, 1995 [JP] Japan .................................. 7-334454

[51] Int. Cl.$^6$ ...................................................... H01S 3/19
[52] U.S. Cl. .............................. 372/45; 372/96; 257/190; 117/93
[58] Field of Search .................. 372/45, 96; 257/190; 117/93

[56] References Cited

U.S. PATENT DOCUMENTS

| | | | |
|---|---|---|---|
| 4,712,219 | 12/1987 | Yano et al. | 372/45 |
| 4,720,836 | 1/1988 | Fukuzawa et al. | 372/96 |
| 5,408,487 | 4/1995 | Uchida et al. | 372/45 |
| 5,456,206 | 10/1995 | Lee et al. | 117/93 |
| 5,495,115 | 2/1996 | Kudo et al. | 257/190 |
| 5,633,516 | 5/1997 | Mishima et al. | 257/190 |

*Primary Examiner*—Rodney Bovernick
*Assistant Examiner*—Sung T. Kim
*Attorney, Agent, or Firm*—Armstrong, Westerman, Hattori, McLeland & Naughton

[57] ABSTRACT

A semiconductor laser having: a group III-V semiconductor substrate; a group III-V semiconductor clad layer disposed on the substrate with a lattice mismatch of 0.5% or more; group III-V semiconductor light propagation layers disposed on the clad layer, including an active layer and light confining layers on both sides of the active layer, the light confining layers containing Al as the group III element; a group III-V semiconductor buffer layer disposed between the substrate and the clad layer, the buffer layer including a composition graded layer gradually changing the lattice constant, and having a cross hatched step on the surface thereof; and an intermediate layer of group III-V semiconductor disposed between the buffer layer and the clad layer, the intermediate layer containing phosphorous as the group V element. A semiconductor laser of 1 $\mu$m band is provided whose substrate and clad layer are lattice mismatched and whose clad layer uses group III-V semiconductor having a wide forbidden band and containing Al as the group III element.

26 Claims, 13 Drawing Sheets

SEMICONDUCTOR LASER WITH LATTICE MISMATCH

This is a divisional of Ser. No. 08/681,336, filed Jul. 23, 1996, now U.S. Pat. No. 5,751,753.

BACKGROUND OF THE INVENTION a) Field of the Invention

The present invention relates to a semiconductor laser, and more particularly to a semiconductor laser having lattice mismatch between its substrate and clad layer.

b) Description of the Related Art

A conventional semiconductor laser of 1 $\mu$m band uses typically an InP substrate and a lamination formed thereon and made of InGaAsP based materials which lattice match the substrate. A heterojunction made of InGaAsP based material which lattice matches InP is difficult to form a sufficiently large band energy gap. Semiconductor lasers having such a heterojunction have the characteristics (threshold value, efficiency, and etc.) greatly dependent upon temperature.

Group III-V semiconductor having the same crystal structure has generally a tendency that the smaller the lattice constant is, the larger the band energy gap and the smaller the refractive index. A difference between band gaps is mainly a difference between energy levels of conduction band edges.

The present inventor and his colleagues have proposed a semiconductor laser including a substrate with a smaller lattice constant and a larger band gap than InP, a clad layer, an active layer, and the like laminated on the substrate through a buffer layer, wherein the buffer layer functions to relax lattice mismatch, and the active layer constitutes a strained quantum well layer (Japanese Patent Laid-open Publication No. 6-326407).

This semiconductor laser uses GaAs as the material of a substrate, a composition graded layer of InGaAs changing its In composition continuously from 0 to 0.3 is formed on the substrate, and a lamination of semiconductor layers of a laser structure is formed on the composition graded layer. The semiconductor layers other than the active layer are made of InGaP, InGaAsP, or InGaAs material which lattice matches $In_{0.3}Ga_{0.7}As$. The active layer is $In_{0.4}Ga_{0.6}As$. Light confining layers of $In_{0.4}Ga_{0.6}As_{0.8}P_{0.2}$ are formed on both sides of the active layer. Clad layers of $In_{0.8}Ga_{0.2}P$ are formed on opposite sides of the light confining layers. The $In_{0.4}Ga_{0.6}As$ active layer and light confining layers on both sides thereof constitute a strained quantum well structure of separate confinement hetero (SCH) structure.

It is possible for the light confining layers to use InGaAsP compositions having a larger energy level of the conduction band edge and a wider forbidden band than InGaAsP composition which lattice matches InP. Leakage of charge carriers was reduced and the temperature characteristic was improved. For example, a characteristic temperature of about 100 K was achieved.

SUMMARY OF THE INVENTION

It is an object of the present invention to provide a semiconductor laser of 1 $\mu$m band having clad layers made of group III-V semiconductor containing Al as group III element and having a wide forbidden band.

It is another object of the present invention to provide a semiconductor laser of 1 $\mu$m band excellent in confinement of charge carriers.

It is a further object of the present invention to provide a semiconductor laser of 1 $\mu$m band excellent in the temperature characteristics.

According to one aspect of the present invention, there is provided a semiconductor laser comprising: a substrate of group III-V semiconductor having a first lattice constant and a primary surface; a clad layer of group III-V semiconductor disposed on the primary surface and having a second lattice constant different from the first lattice constant by 0.5% or more; a light propagation layer of group III-V semiconductor disposed on the clad layer, the light propagation layer including an active layer and light confining layers disposed on both sides of the active layer, the light confining layers containing Al as a group III element and having a refractive index lower than the active layer; a buffer layer of group III-V semiconductor disposed between the primary surface and the clad layer, the buffer layer including a composition graded layer gradually changing a lattice constant in the range between the first and second lattice constants, and having a cross hatched step on the surface thereof; and an intermediate layer of group III-V semiconductor disposed between the buffer layer and the clad layer, the intermediate layer containing phosphorous as a group V element.

A semiconductor layer containing Al as the group III element provides a wide forbidden band. By interposing the buffer layer on the semiconductor substrate, the clad layer can be grown on the buffer layer, the clad layer having a lattice constant different from that of the semiconductor substrate by 0.5% or more. However, such a buffer layer sometimes has a cross hatched step on the surface thereof.

If semiconductor layers are grown over the underlying surface having such a cross hatched step and the layers inherit the morphology of the underlying surface, each semiconductor layer has a cross hatched step and it becomes difficult to form a laser resonator.

By inserting the intermediate layer of group III-V semiconductor containing phosphorous as a group V element between the buffer layer and clad layer, it becomes possible to transform the cross hatched step to a stripe step. A laser resonator can be formed along the stripe direction.

If the clad layer containing Al as a group III element is formed on the intermediate layer, better confinement effects of charge carriers can be realized. Since the underlying surface has a stripe step, laser oscillation is possible.

According to another aspect of the present invention, there is provided a semiconductor laser comprising: a substrate of group III-V semiconductor having a first lattice constant and a primary surface; a clad layer of group III-V semiconductor disposed on the primary surface and having a second lattice constant different from the first lattice constant by 0.5% or more, the clad layer containing Al as a group III element; a light propagation layer of group III-V semiconductor disposed on the clad layer, the light propagation layer including an active layer and light confining layers disposed on both sides of the active layer, the light confining layers containing Al as a group III element and having a refractive index lower than the active layer; a buffer layer of group III-V semiconductor disposed between the primary surface and the clad layer, the buffer layer including a composition graded layer gradually changing a lattice constant in the range between the first and second lattice constants, and having a cross hatched step on the surface thereof; an intermediate layer of group III-V semiconductor disposed between the buffer layer and the clad layer, the intermediate layer containing phosphorous as a group V element; and a planarizing layer of group III-V semiconductor disposed between the intermediate layer and the clad layer, the planarizing layer having a phosphorous composition as a group V element smaller than the phosphorous composition of the group III-V semiconductor of the intermediate layer and having an Al composition as a group III element smaller than the Al composition of the group III-V semiconductor of the clad layer.

By growing on the intermediate layer the planarizing layer having a phosphorous composition smaller than the intermediate layer and an Al composition smaller than the clad layer, it becomes possible to gradually planarize the stripe pattern. After the planarization, other semiconductor layers can be formed to obtain a laser structure without steps.

According to a further aspect of the present invention, there is provided a group III-V semiconductor device comprising: a substrate of group III-V semiconductor having a first lattice constant and a primary surface; a buffer layer disposed on the primary surface and having a lattice constant gradually changing from the first lattice constant to a second lattice constant different from the first lattice constant by 0.5% or more; and a lamination of a plurality of layers disposed on the buffer layer, the lamination including a first layer of group III-V semiconductor containing Al as a group III element, a second layer of group III-V semiconductor containing phosphorous as a group V element, and a GaAs layer directly sandwiched between the first and second layers.

By inserting the GaAs layer at the heterojunction between the first layer of group III-V semiconductor containing Al and the second layer of group III-V semiconductor containing phosphorous, crystallinity at the heterojunction can be prevented from being degraded.

As above, semiconductor lasers having excellent characteristics can be provided.

Semiconductor lasers excellent in the temperature characteristics can be formed using material with a wide forbidden band.

A semiconductor layer excellent in crystallinity can be grown because the surface morphology of epitaxial growth can be improved.

DETAILED DESCRIPTION OF THE PREFERRED EMBODIMENTS

Embodiments of the invention will be described with reference to the accompanying drawings. In the following description, the active layer constituting a laser of 1.3 $\mu$m band and made of $In_{0.4}Ga_{0.6}As$ and the substrate made of GaAs are used, which are illustrative only and do not limit the scope of the invention. GaAs and $In_{0.4}Ga_{0.6}As$ have large lattice mismatch and $In_{0.4}Ga_{0.6}As$ cannot be grown in single crystal directly on GaAs. It is therefore necessary to use a buffer layer whose component is gradually changed.

Figure 1:
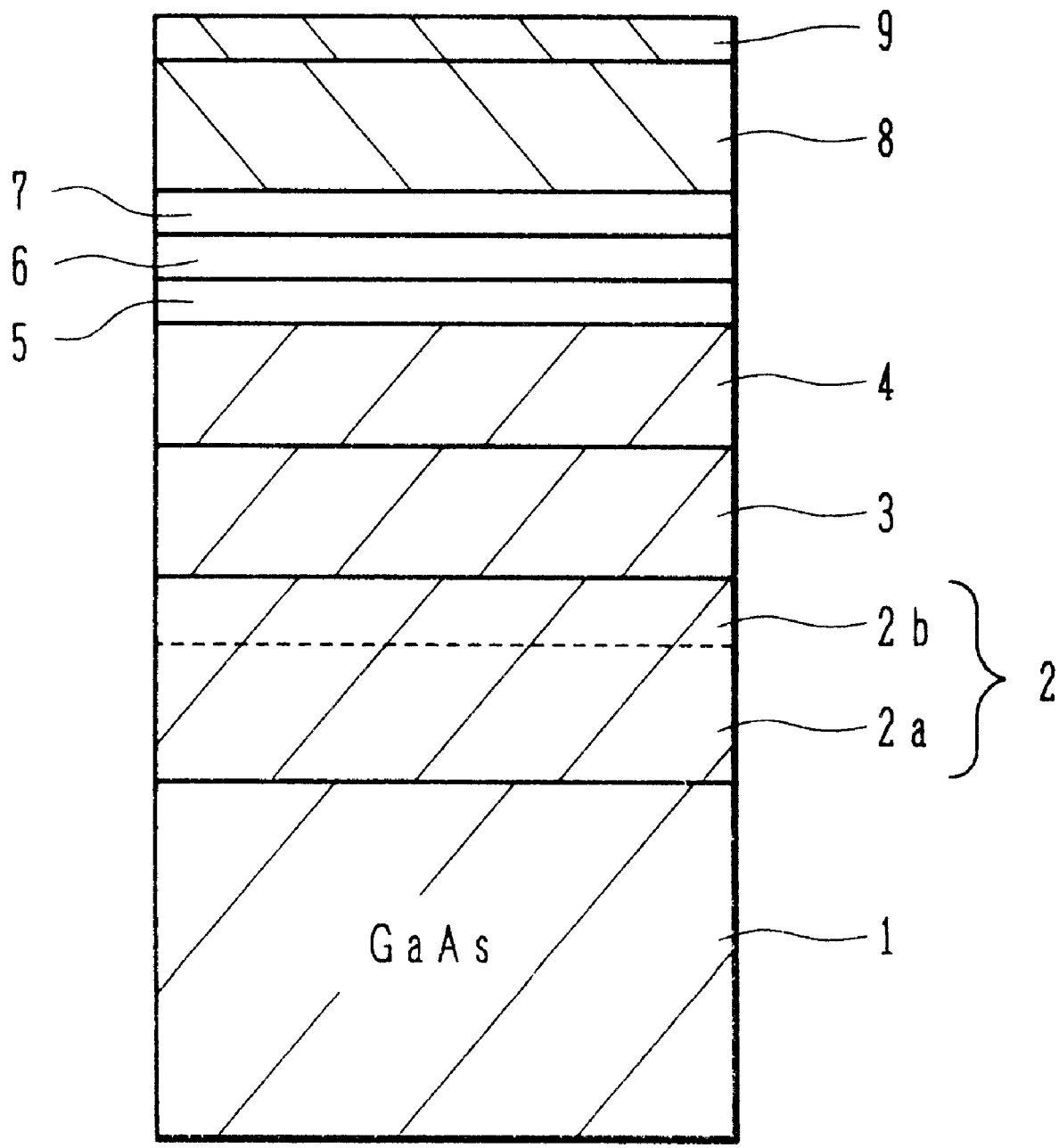
FIG. 1 is a cross sectional view showing the structure of a semiconductor laser according to an embodiment of the invention.

FIG. 1 shows the structure of a semiconductor laser of 1.3 $\mu$m. On an n-type GaAs substrate 1, an n-type InGaAs buffer layer 2 is grown. The n-type GaAs substrate 1 has an impurity concentration of $5\times10^{17}$ to $5\times10^{18} cm^{-3}$, or preferably about $1\times10^{18} cm^{-3}$. The buffer layer 2 has an impurity concentration of $5\times10^{17}$ to $5\times10^{18} cm^{-3}$, or preferably about $1\times10^{18} cm^{-3}$ and a thickness of 2 to 5 $\mu$m or preferably about 3 $\mu$m.

The buffer layer 2 includes a composition graded layer 2a of about 2.0 $\mu$m thick whose in composition continuously or stepwisely changes, for example, from 0 to 0.3 and a uniform composition layer 2b formed on the graded layer 2a and having a thickness of about 1.0 $\mu$m and made of the same compositions of $In_{0.3}Ga_{0.7}As$.

A semiconductor layer can be formed on this buffer layer 2, if it has a lattice constant generally matching the surface lattice constant of the buffer layer 2. It is therefore possible to grow on the GaAs substrate a mixed crystal semiconductor layer having a lattice constant different by 0.5% or more and form a semiconductor laser of 1 $\mu$m band. With this buffer layer, it is also possible to reduce the density of threading dislocations to $10^6 cm^{-2}$ or smaller. In lowering the density of threading dislocations, the composition graded layer stepwise changing the In composition is particularly effective.

However, the surface of the grown buffer layer has cross-hatched steps with an average height of about 20 nm and a distance of about 1 to 5 $\mu$m between adjacent steps.

Figure 2A:
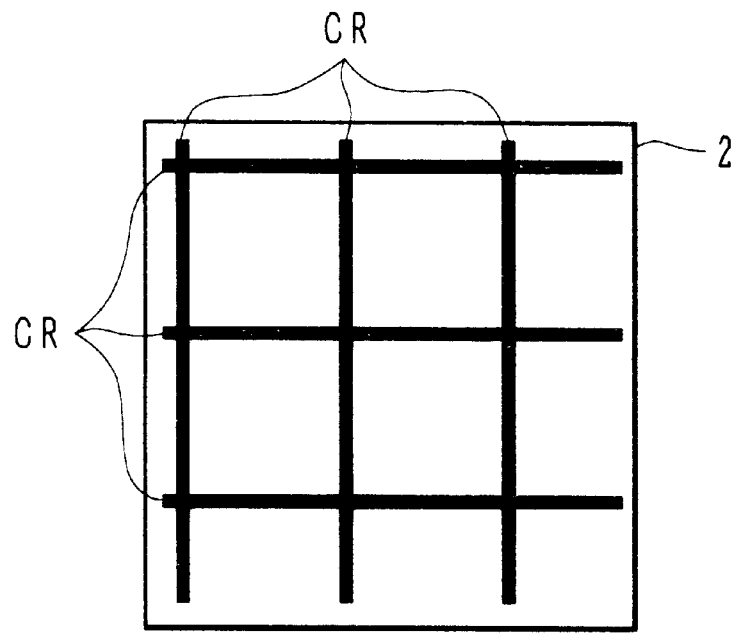
FIGS. 2A and 2B are schematic plan views illustrating surface morphology of the embodiment shown in FIG. 1.

FIG. 2A is a schematic diagram showing a step pattern materializing on the surface of the buffer layer 2. The cross hatched (lattice) pattern CR corresponds to a lower area on the surface of the buffer layer 2, and the area surrounded by the pattern CR corresponds to a swelled area higher than the lower area. Although FIG. 2A schematically shows such lower and swelled areas, a change in height of these areas is continuous. The distance between adjacent patterns CR is about 1 to 5 $\mu$m and the average height difference between the lower area CR and swelled area is about 20 nm. The height of the surface changes also along the direction of a straight lower area pattern CR.

The buffer layer gradually changes its lattice constant so as to allow an upper level semiconductor layer to be grown on the buffer layer formed on the underlying layer having a lattice constant greatly different from the upper level semiconductor layer. Therefore, the buffer layer has inevitably a large amount of strains therein.

When an AlGaInAs based semiconductor layer capable of widening the forbidden band was grown on the underlying layer having a cross hatched step pattern, the surface of the semiconductor layer was also formed with a cross hatched step pattern. It is very difficult to realize a laser structure by using a semiconductor layer having such a cross hatched step pattern.

If a buffer layer without a step pattern can be formed, the above problem can be solved. In this embodiment, however, the cross hatched step of the buffer layer is considered as the inevitable and the other structure is rather incorporated to transform the cross hatched step into the surface morphology practically usable.

An $n^+$-type $In_{0.8}Ga_{0.2}P$ intermediate layer 3 is formed on the buffer layer 2. The intermediate layer 3 has an impurity concentration of $5\times10^{17}$ to $5\times10^{19}cm^{-3}$, or preferably about $1\times10^{19}cm^{-3}$ and a thickness of 0.5 to 2 $\mu$m or preferably about 1 $\mu$m. The compositions $In_{0.8}Ga_{0.2}As$ of the intermediate layer 3 lattice match the compositions $In_{0.3}Ga_{0.7}As$ of the buffer layer at its surface area. The surface morphology of the intermediate layer 3 changes from the cross hatch of the buffer layer 2 to a stripe step pattern.

Figure 2B:
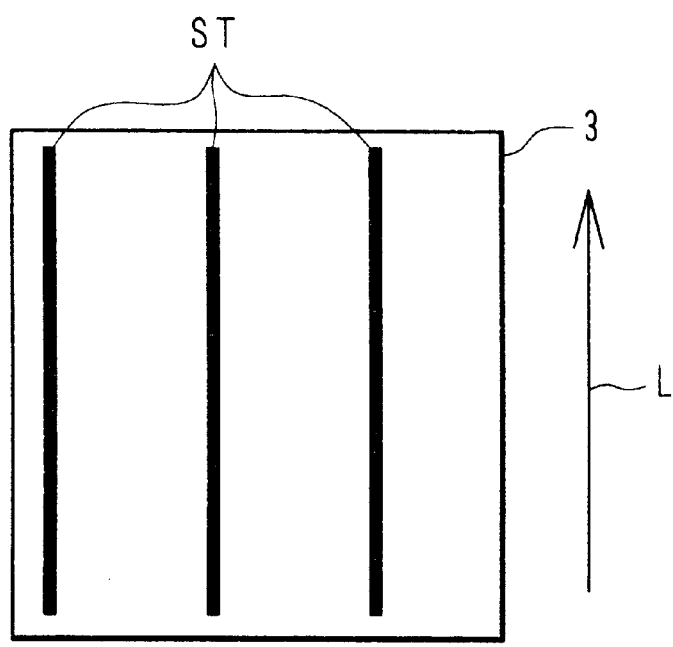

FIG. 2B is a schematic diagram of the surface morphology of the intermediate layer 3. The cross hatched step pattern CR shown in FIG. 2A changes to a stripe step pattern ST. The linear pattern indicated at ST in FIG. 2B corresponds to a lower area of the surface. The distance between adjacent stripe patterns ST is about 1 to 5 $\mu$m like that of the cross hatched step pattern CR. An average height difference between the lower and higher areas is about 200 nm. Although the height difference along the direction perpendicular to the stripe direction L becomes large, the surface along the direction parallel to the stripe direction L is planarized.

Group III-V semiconductor having As as the group V element, such as InGaAs and AlGaInAs, inherits the surface morphology of underlying crystals. If the surface morphology of underlying crystals is a cross hatched step pattern, the surface morphology of such crystal layer is also a cross hatched step pattern.

However, group III-V semiconductor layer having P as the group V element such as InGaP changes its surface morphology. For example, if the surface morphology of underlying crystals is a cross hatched step pattern, the surface morphology of the crystal layer having P as the group V element changes to a stripe step pattern.

The above empirically obtained knowledge has led to the intermediate layer 3. It is preferable to dope impurities at a high concentration, e.g., about $1\times10^{19}cm^{-3}$, into the intermediate layer 3. The above advantageous effects can be obtained not only by group III-V semiconductor having P as a single group V element but also by group III-V semiconductor containing P as one of the group V elements.

After changing the surface morphology to the stripe step pattern, an n-type $Al_{0.5}Ga_{0.2}In_{0.3}As$ clad layer 4 is formed on the intermediate layer 3, using AlGaInAs based material having a wide forbidden band. The clad layer 4 has an impurity concentration of $5\times10^{17}$ to $5\times10^{18}cm^{-3}$, or preferably about $1\times10^{18}cm^{-3}$ and a thickness of 0.5 to 2 $\mu$m or preferably about 1 $\mu$m.

Figure 3A:
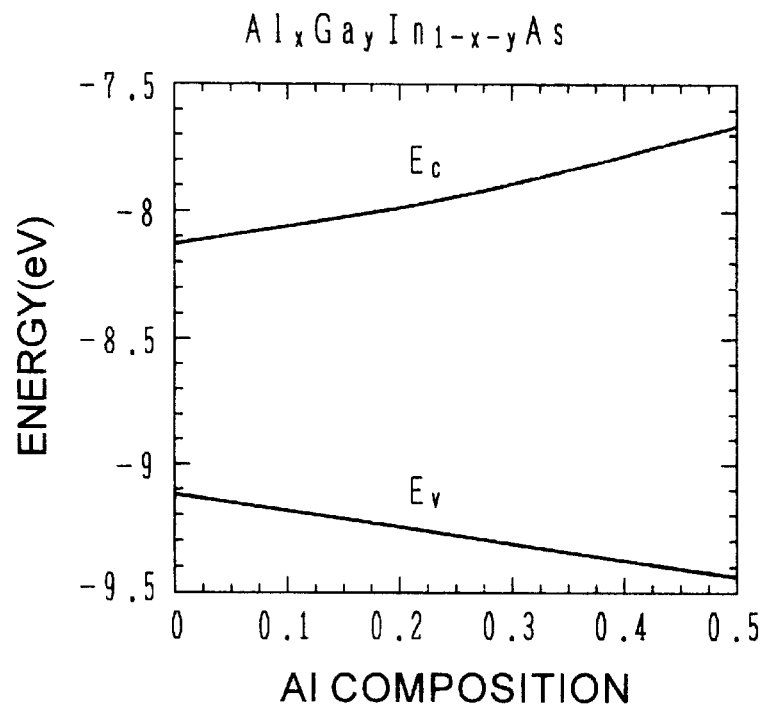
FIGS. 3A and 3B are graphs showing a band energy change with compositions of AlGaInAs and InGaAsP.
Figure 3B:
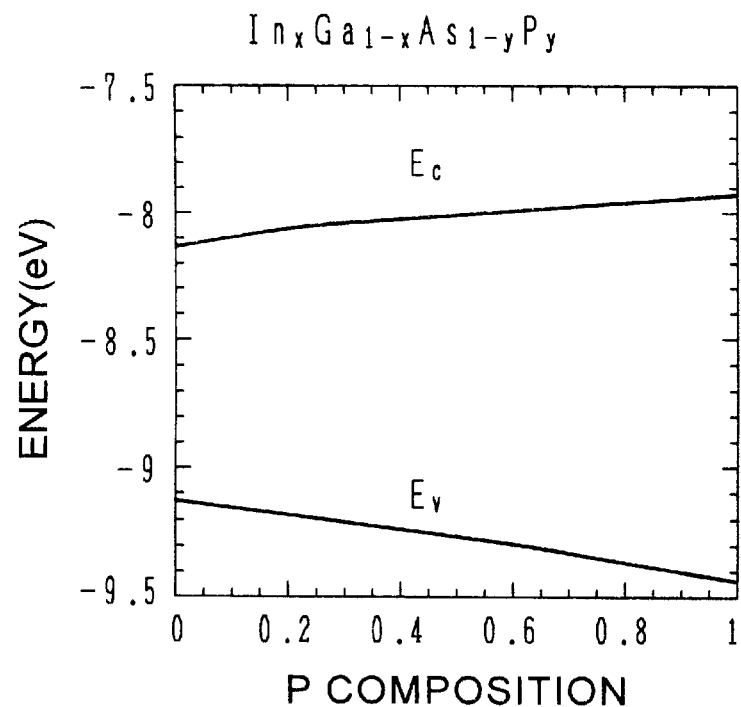

FIGS. 3A and 3B are graphs showing the energy band structures of $Al_xGa_yIn_{1-x-y}As$ and $In_xGa_{1-x}As_{1-y}P_y$ lattice matching $In_{0.3}Ga_{0.7}As$. In FIG. 3A, the abscissa represents the Al composition x of $Al_xGa_yIn_{1-x-y}As$ and the ordinate represents the energy eV. In FIG. 3B, the abscissa represents the P composition y of $In_xGa_{1-x}As_{1-y}P_y$ and the ordinate represents the energy eV. As the Al composition x or the P composition y is changed, the other composition is also changed to lattice match $In_{0.3}Ga_{0.7}As$.

As shown in FIGS. 3A and 3B, the energy Ev at the valence band edge is generally the same for both AlGaInAs and InGaAsP. In contrast, the energy Ec at the conduction band edge is larger for AlGaInAs than for InGaAsP. Therefore, the forbidden band of AlGaInAs is wider than that of InGaAsP. Semiconductor material having a wide forbidden band allows formation of a higher potential barrier and a lower refractive index and realizes strong confinement effects for charge carriers and light, resulting in better laser characteristics.

Referring back to FIG. 1, on the clad layer 4, a non-doped $Al_{0.2}Ga_{0.5}In_{0.3}As$ light confining layer 5, a non-doped $In_{0.4}Ga_{0.6}As$ active layer 6, and a non-doped $Al_{0.2}Ga_{0.5}In_{0.3}As$ light confining layer 7 are sequentially stacked. The light confining layers 5 and 7 have a thickness of 0.05 to 0.2 $\mu$m, or preferably about 0.1 $\mu$m. The active layer 6 has a thickness of 5 to 15 nm, or preferably about 7 nm. The active layer sandwiched between the light confining layers constitutes a strained quantum well structure of SCH.

Although only one active layer is formed, a plurality of active layers separated by barrier layers may be used. The barrier layer may be made of the same material as the light confining layer. The barrier layer is made thinner than the light confining layer to facilitate motion of charge carriers.

On the light confining layer 7, a p-type $Al_{0.5}Ga_{0.2}In_{0.3}As$ clad layer 8 and a $p^+$-type $In_{0.3}Ga_{0.7}As$ contact layer 9 are sequentially formed. The clad layer 8 has an impurity concentration of $5\times10^{17}$ to $2\times10^{16}cm^{-3}$, or preferably about $1\times10^{18}cm^{-3}$ and a thickness of 0.5 to 2 $\mu$m or preferably about 1 $\mu$m. The contact layer 9 has an impurity concentration of $1\times10^{19}$ to $5\times10^{19}cm^{-3}$, or preferably about $2\times10^{19}cm^{-3}$ and a thickness of 0.1 to 1 $\mu$m or preferably about 0.5 $\mu$m.

The semiconductor layers formed above the buffer layer 2 have the compositions lattice matching $In_{0.3}Ga_{0.7}As$, excepting the active layer 5. Such a lamination structure provides a semiconductor laser of 1 $\mu$m band (radiation wavelength of 1.3 $\mu$m) excellent in the confinement effects of charge carriers and light.

Since the direction of a laser resonator is set along the stripe direction of the stripe step pattern, almost no step exists along the propagation direction of a laser beam although the average height difference between stripe steps is large. Laser oscillation is therefore possible.

Although $Al_{0.5}Ga_{0.2}In_{0.3}As$ having a wide forbidden band is used as the clad layer, other compositions such as $Al_{0.4}Ga_{0.3}In_{0.3}As$ may be used. Instead of AlGaInAs, AlInAs may be used. The same is also true for the light confining layer. However, as the Al component is decreased, the forbidden band narrows. In order to improve the temperature characteristics and the carrier confinement characteristics, it is preferable to use material having a wide forbidden band.

Such a lamination structure can be grown, for example, by metal organic chemical vapor deposition (MOCVD). Examples of crystal growth conditions will be described. An Si doped GaAs substrate having the plane (100) is used. The growth pressure is 30 to 80 Torr and the growth temperature is 650 to 700° C. In growing the buffer layer, the growth temperature is set higher, e.g., 700° C., and in growing the other layers, it is set lower, e.g., 650° C.

The group III source material is organic metal materials such as trimethylindium (TMI), triethylgallium (TEG), and trimethylaluminum (TMA), and the group V source material is arsine ($AsH_3$) or phosphine ($PH_3$). Hydrogen selenide ($H_2Se$) is used as n-type dopant for an n-type region, and diethyl zinc (DEZn) as p-type dopant.

The growth speed is about 1.2 to 2.4 μm/hour. In growing an InGaP intermediate layer for improving the surface morphology, the growth speed is set to 2.4 μm/hour, and in growing the other layers, it is set to 1.2 μm/hour.

A V/III ratio is set to 100 to 250. In growing the layers containing P as a group V element or Al as a group III element, the V/III ratio is set to about 250, and in growing the other layers, it is set to 100.

Some attention is to be paid to the source gas supply sequence when the hetero structure is formed. The procedure of changing source gas will be described.

(1) In forming a heterojunction by a layer containing P and a layer containing As as the group V element (e.g., a change between an InGaP layer and an InGaAs layer):

the supply of group III source material is stopped and maintained in this state for a time period of 10 seconds (In the first 5 seconds, the amount of group V material supplied to the reaction chamber is reduced by ½ to ¼);

a change to the group V source material is performed in 0 to 3 seconds (a change from As to P is performed in 3 seconds, and a change from P to As is performed in 0 second); and a supply of group III source material resumes.

(2) In forming a heterojunction without a change between As/P (e.g., InAlAs/InGaAs):

the supply of group III source material is stopped and maintained in this state for a time period of 5 seconds; and a supply of group III source material resumes.

(3) In forming a buffer layer having a continuous component gradation:

the mass flows are continuously and linearly controlled.

(4) In forming a buffer layer having a stepwise component gradation:

the supply control same as the formation of a heterojunction without a change between As/P is performed.

In the structure of the active layer, the thickness of a well layer is 5 to 10 nm or preferably about 7 nm, and the number of well layers is 2 to 7 or preferably 5. If a plurality of well layers are formed, a barrier layer is inserted between well layers. The barrier layer may be made of the same material as the light confining layer and formed thinner than that. The strain amount of the well layer is preferably 0.5 to 1.5%. Although it is preferable that the strain amount is large, there is an upper limit from the viewpoint of crystallinity, and it is set to about 1% or less, for example. The barrier layer may be made of the same material as the light confining layer and formed thinner than that.

In the embodiment of FIG. 1, the clad layer is formed on the intermediate layer which improves the surface morphology. If the intermediate layer has a sufficiently wide forbidden band (lower refractive index), it may be used as the clad layer.

Figure 4:
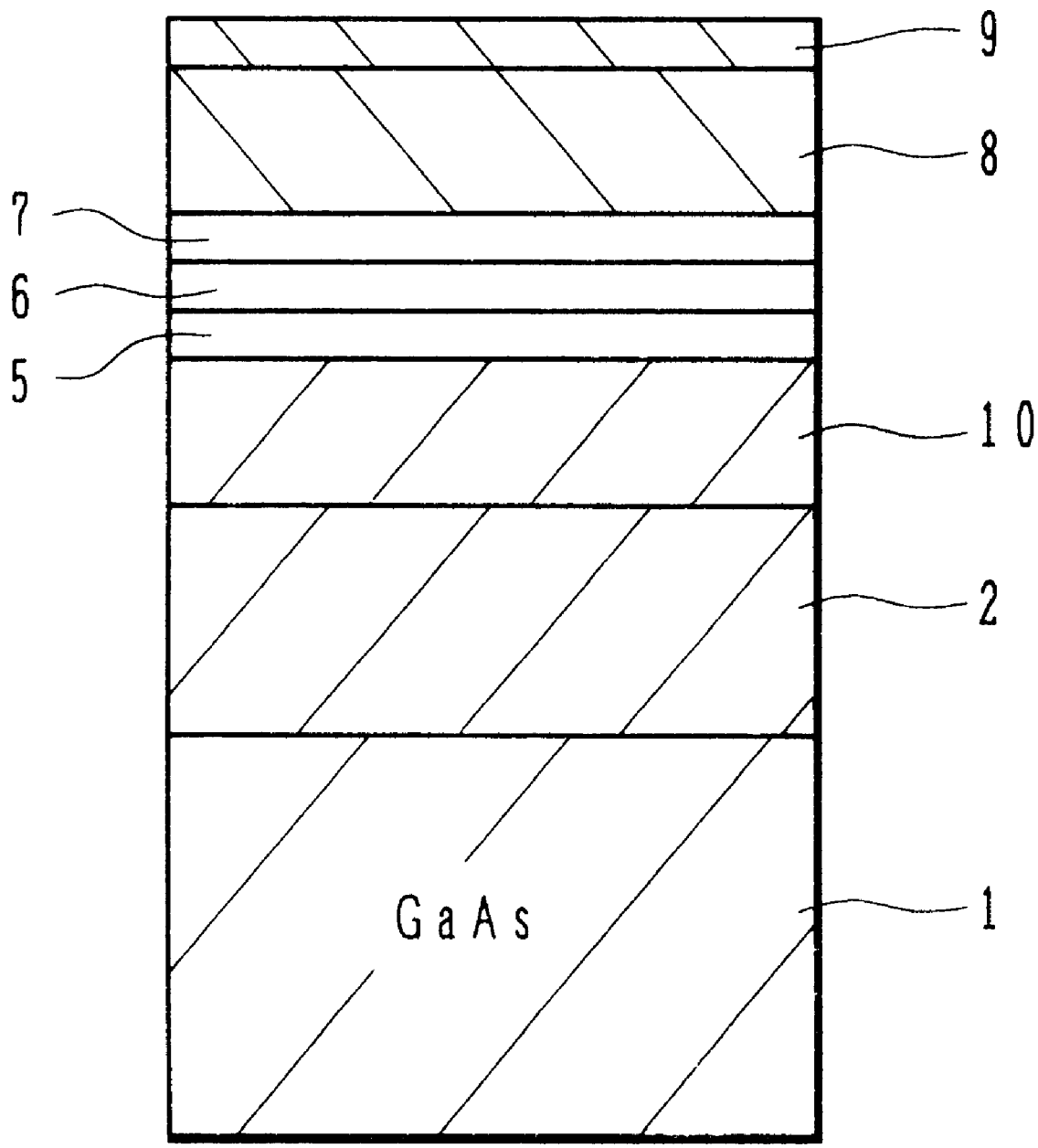
FIG. 4 is a cross sectional view showing the structure of a semiconductor laser according to another embodiment of the invention.

FIG. 4 shows the lamination structure of a semiconductor laser according to another embodiment of the invention. Different points from the first embodiment will be described mainly. That a buffer layer 2 is formed on a GaAs substrate 1 is the same as the embodiment of FIG. 1.

On the buffer layer, an $n^+$-type $In_{0.8}Ga_{0.2}P$ intermediate/clad layer 10 similar to the intermediate layer shown in FIG. 1 is formed. On this intermediate/clad layer 10, a light confining layer 5, an active layer 6, and a light confining layer 7 are grown similar to the embodiment of FIG. 1. On the light confining layer 7, a p-type clad layer 8 of $In_{0.6}Ga_{0.2}P$ same as the intermediate/clad layer 10 is formed. On this clad layer 8, a p-type contact layer 9 of $In_{0.3}Ga_{0.7}As$ like the embodiment of FIG. 1 is formed. As compared to the embodiment shown in FIG. 1, the number of necessary layers is reduced by one and the structure is simplified.

In the above embodiments, the cross hatched step pattern is transformed into a stripe step pattern on which a laser structure is formed. Even if the stripe step pattern exists, laser oscillation becomes possible by making the oscillation direction of the laser resonator in parallel to the stripe. However, if the stripe step pattern is removed, improvement on crystal property and laser characteristics can be expected.

Figure 5:
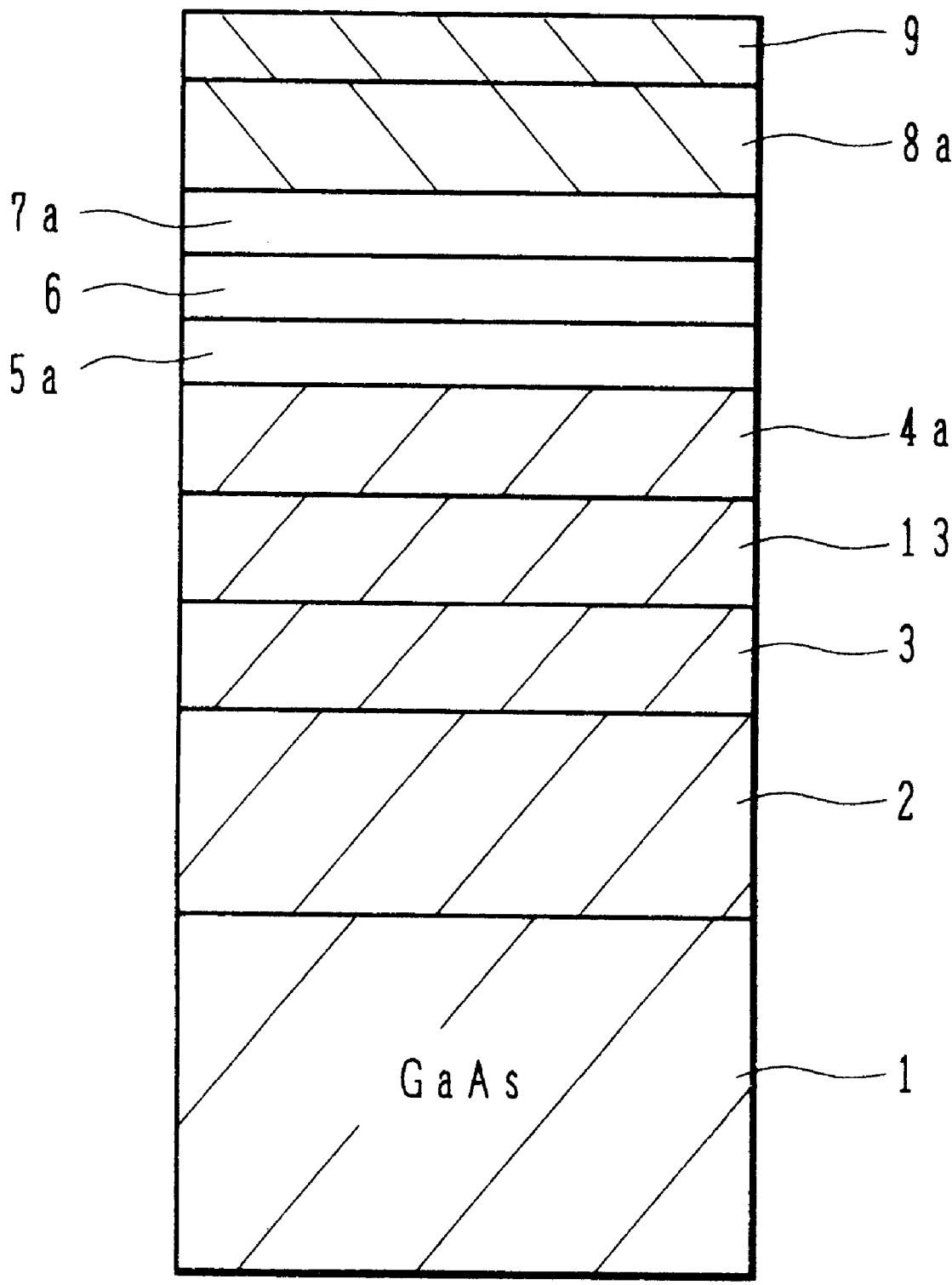
FIG. 5 is a cross sectional view showing the structure of a semiconductor laser according to a further embodiment of the invention.

FIG. 5 shows the lamination structure of a semiconductor laser according to a further embodiment of the invention. A semiconductor substrate 1, a buffer layer 2, an intermediate layer 3 are similar to the above embodiments. As described earlier, although a cross hatched step pattern is formed on the surface of the buffer layer 2, this pattern is changed to a stripe step pattern by forming the intermediate layer 3.

On the intermediate layer 3, a planarizing layer 13 of n-type $In_{0.3}Ga_{0.7}As$ is formed. As the $In_{0.3}Ga_{0.7}As$ layer is grown, although it inherits the surface morphology of the underlying crystals, the apexes of the strip patterns are gradually flattened. In other words, a flat area is formed on the apex of each stripe step. This flat area extends laterally as the planarizing layer is made thicker. For example, if the $InA_{0.2}Ga_{0.7}As$ layer is deposited 0.5 μm or thicker, the whole surface becomes generally flat.

In the example shown in FIG. 5, on the intermediate layer 3, the planarizing layer 13 of n-type $In_{0.3}Ga_{0.7}As$ is formed 0.5 μm or thicker, or preferably 1 μm. The surface of this planarizing layer 13 becomes generally flat. The planarizing layer 13 has an impurity concentration of $5 \times 10^{17}$ to $5 \times 10^{18} cm^{-3}$, or preferably about $1 \times 10^{18} cm^{-3}$.

Figure 6A:
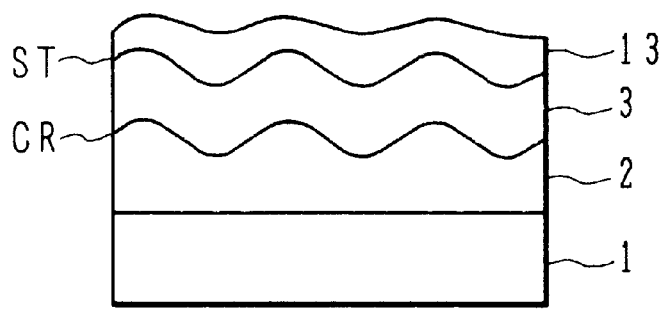
FIGS. 6A to 6C are schematic cross sectional views illustrating a change in surface morphology of the embodiment shown in FIG. 5.
Figure 6B:
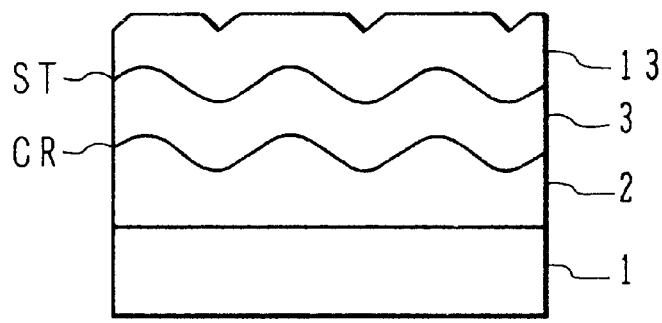
Figure 6C:
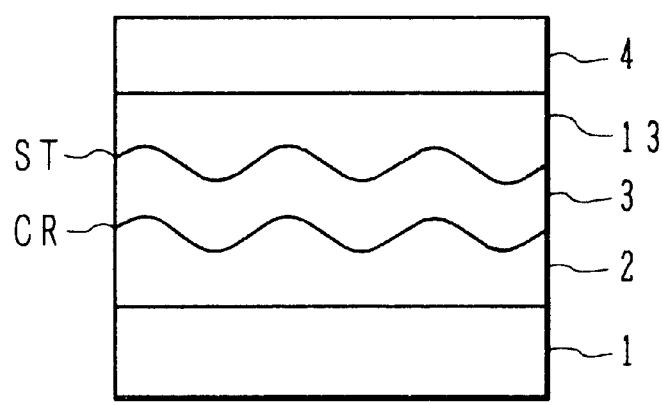

A change in the surface of the planarizing layer is illustrated in FIGS. 6A to 6C.

As shown in FIG. 6A, a cross hatched step pattern CR is formed on the surface of the buffer layer 2, and a stripe step pattern ST is formed on the surface of the intermediate layer 3. As the planarizing layer 13 is grown on the surface of the intermediate layer 3, a step pattern inheriting the morphology of the underlying surface is formed at the growth initial stage. As shown in FIG. 6B, as the planarizing layer 13 is further grown, a flat area is formed near at the apex of each step and extends laterally thereafter.

As the growth further proceeds, the whole surface of the planarizing layer 13 becomes generally flat. If the clad layer 4 is formed on this planarized surface, it also has a flat surface.

Although $In_{0.3}Ga_{0.7}As$ is used as the planarizing layer, other compositions may be used. However, in this case, the following points must be taken into consideration. If the group V element is P, although the function of changing the cross hatched step pattern to the stripe step pattern is strong, it is difficult to remove the stripe step pattern.

The composition of Al in place of Ga is preferably set as high as possible if a wide forbidden band is to be formed. If Ga is replaced by Al, the forbidden band becomes wide with the lattice constant being changed less. If the group V element is As and semiconductor containing much Al as the group III element, e.g., semiconductor having an Al composition of 0.5 or more, the surface morphology of the underlying crystals is inherited at high possibility.

If the Al composition is small, the step becomes gradually small, and generally the flat surface can be formed if the planarizing layer is deposited sufficiently thick.

For example, usable semiconductor has the Al component smaller than 0.2 and contains As as the group V element. However, the forbidden band of this layer becomes narrower correspondingly as the Al composition is lowered. It is preferable that the planarizing layer 13 has the P composition of the group V element smaller than that of the underlying intermediate layer 3 and the Al composition of the group III smaller than that of the upper level layer.

Once a planarized surface is obtained, the clad layer, active layer, and other layers formed on the planarized surface have also the flat surfaces. These planarized layers also reduce crystal defects. If group III-V semiconductor with a wide forbidden band is used as the clad layer, good confinement effects of charge carriers can be obtained.

Reverting to FIG. 5, on the planarized layer 13 with a flat surface, an n-type clad layer 4a, a light confining layer 5a, an active layer 6, a light confining layer 7a, and a p-type clad layer 8a are sequentially formed.

The n-type clad layer 4a is made of n-type $Al_{0.7}In_{0.3}As$ having an impurity concentration of $5\times10^{17}$ to $5\times10^{18} cm^{-3}$ or preferably about $1\times10^{18} cm^{-1}$ and a thickness of 0.5 to 2 $\mu$m or preferably about 1 $\mu$m. The light confining layers 5a and 7a are made of non-doped $Al_{0.4}Ga_{0.6}In_{0.3}As$ having a thickness of 0.05 to 0.2 $\mu$m or preferably about 0.1 $\mu$m. The active layer 6 is made of non-doped $In_{0.4}Ga_{0.6}As$ having a thickness of 5 to 15 nm or preferably about 7 nm. The p-type clad layer 8a is made of p-type $Al_{0.7}In_{0.3}As$ having an impurity concentration of $5\times10^{17}$ to $2\times10^{18} cm^{-3}$ or preferably about $1\times10^{16} cm^{-3}$ and a thickness of 0.5 to 2 $\mu$m or preferably about 1 $\mu$m.

On the p-type clad layer 8a, a $p^+$-type $In_{0.3}Ga_{0.7}As$ contact layer 9 is formed. The contact layer 9 has an impurity concentration of $1\times10^{19}$ to $5\times10^{19} cm^{-3}$ or preferably $2\times10^{19} cm^{-3}$ and a thickness of 0.1 to 1 $\mu$m or preferably about 0.5 $\mu$m. Since the surface of the planarized layer 13 is flat, the layers formed over the planarized layer 13 are flat.

Although a single active layer is used, the structure of a plurality of active layers separated by barrier layers is more preferable. The active layer 6 constitutes SCH structures together with the light confining layers 5a and 7a formed on both sides of the active layer 6.

An n-type electrode is formed on the substrate 1 and a p-type electrode is formed on the contact layer 9, and a laser resonator is formed by cleavage to complete a semiconductor laser.

In this embodiment, since the clad layer, light confining layers, and active layer are flat, crystal defects can be reduced and the characteristics of the semiconductor laser can be improved.

In the above embodiment, although $Al_{0.7}In_{0.3}As$ with no Ga composition is used as the clad layer, AlGaInAs based material such as $Al_{0.5}Ga_{0.2}In_{0.3}As$ may also be used.

Although InGaAs not containing Al and P is most suitable for the planarizing layer, other semiconductor layers such as InGaAsP and AlGaInAsP may be used which have a P composition smaller than the underlying intermediate layer of $In_{0.8}Ga_{0.2}P$ and an Al composition smaller than the $Al_{0.7}In_{0.3}As$ clad layer. The composition ratios are selected so as to lattice match the underlying intermediate layer and upper clad layer.

Apart from surface planarization, formation of hetero junctions are likely to degrade crystal quality. If the buffer layer of material containing particularly Al is grown, the crystal quality is degraded as the heterojunction is formed.

The inventor has learned about a method of improving the crystal quality when the heterojunction is formed.

A heterojunction is formed between the intermediate layer of InGaP and the clad layer of AlGaInAs. A heterojunction is also formed between the intermediate/clad layer of InGaP and the light confining layer of AlGaInAs. First, it was checked how the crystal quality at the heterojunction was changed if a GaAs layer is inserted at the heterojunction.

Figure 7A:
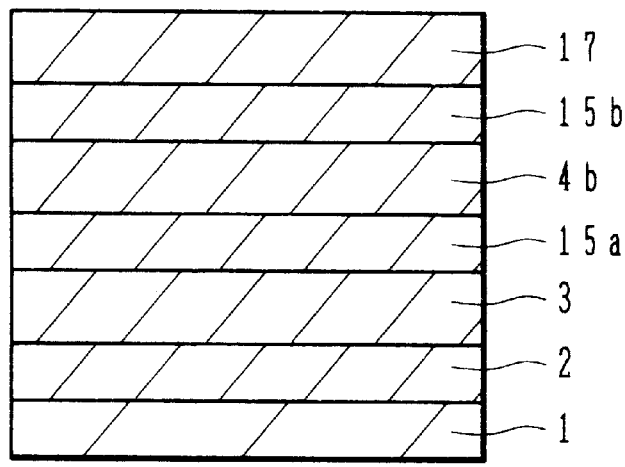
FIGS. 7A and 7B are a cross sectional view showing the structure of samples used for the experiments of confirming a change in crystallinity, and a graph showing the measurement results.
Figure 7B:
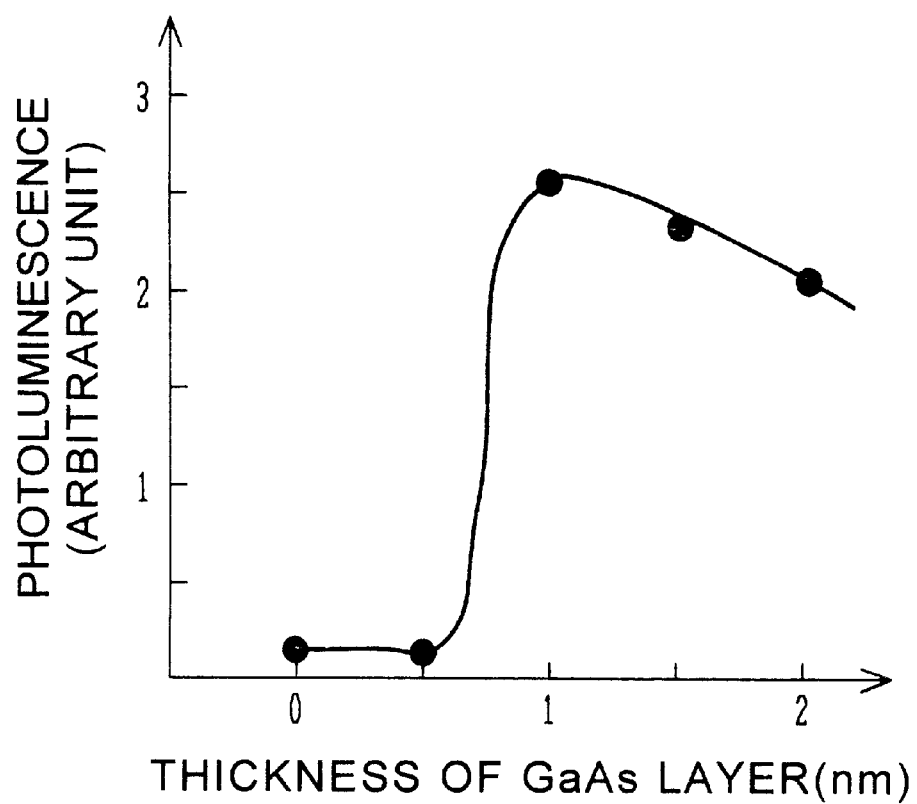

FIGS. 7A and 7B show the structure of samples and the measurement results. FIG. 7A shows the structure of samples. The structure of a substrate 1, a buffer layer 2, and an intermediate layer (also as a clad layer) 3 is the same as the above-described embodiment. On the intermediate layer 3, a GaAs layer 15a was formed, on this GaAs layer 15a, an AlGaInAs layer 4b was formed, and on this layer 4b a GaAs layer 15b was formed on which an InGaP layer 17 was formed. Namely, this structure is a sandwich structure that the AlGaInAs layer 4b is sandwiched between the InGaP layers 3 and 17 with the GaAs layers 15a and 15b being interposed therebetween. This structure is suitable for checking the effects of the GaAs layer inserted at the heterojunction of InGaP/AlGaInAs.

The thickness of the GaAs layers 15a and 15b of this sample structure was changed, and the photoluminescence (PL) intensity from the AlGaInAs layer 4b was measured. The composition of the AlGaInAs layer 4b is $Al_{0.2}Ga_{0.5}In_{0.3}As$ and that of the InGaP layers 3 and 17 is $In_{0.8}Ga_{0.2}P$.

FIG. 7B shows the measurement results. The abscissa represents a thickness of a GaAs layer and the ordinate represents a photoluminescence intensity in an arbitrary unit. The thickness of the GaAs layer indicated at the abscissa is a value estimated from an amount of supplied source material. If the GaAs layer is not inserted (thickness of the GaAs layer is 0), the photoluminescence intensity is extremely weak. Even if a GaAs layer of 0.5 nm thick is inserted, the photoluminescence intensity is hardly improved. However, if a GaAs layer of 1 nm thick is inserted, the photoluminescence intensity becomes considerably strong. As the thickness is further increased, the photoluminescence intensity gradually decreases.

It can be expected from the measurement results shown in FIG. 7B that crystallinity of AlGaInAs clad layer can be improved if a GaAs layer having a thickness of about 0.7 nm or more is inserted between the InGaP intermediate layer and AlGaInAs clad layer.

It can be reasoned from the measurement results shown in FIG. 7B that crystal at the initial GaAs growth stage fills mainly recesses and the surface flatness is suddenly improved when the GaAs layer is grown to about 0.7 nm thickness.

As the GaAs layer is grown more than about 1 nm, the photoluminescence intensity gradually lowers. This phenomenon may be ascribed to that although a very thin GaAs film does not affect so much the growth of an AlGaInAs layer, a thick GaAs film demonstrates its intrinsic property and hinders the growth of the AlGaInAs more or less.

The active layer of a semiconductor laser of 1 $\mu$m band is possibly InGaAs. More specifically, with a high possibility, a well layer of InGaAs is formed and AlGaInAs layers are formed on both sides of the well layer. A change in crystallinity was checked by using this combination of layers and a GaAs layer inserted therebetween.

Figure 8A:
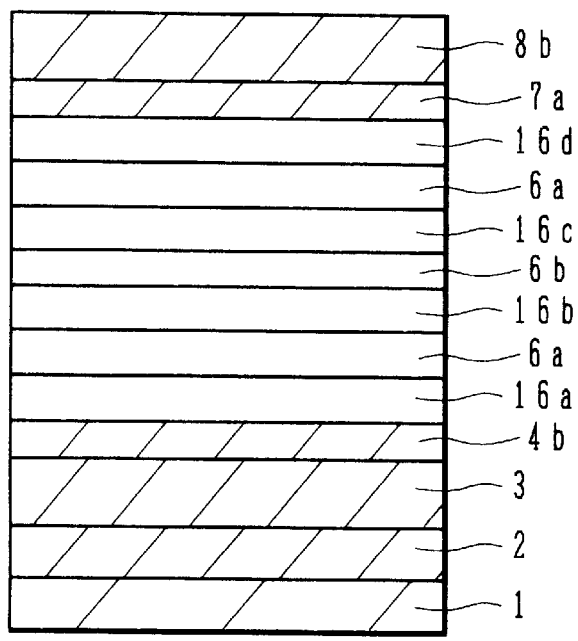
FIGS. 8A and 8B are a cross sectional view showing the structure of samples used for the experiments of confirming a change in crystallinity, and a graph showing the measurement results.
Figure 8B:
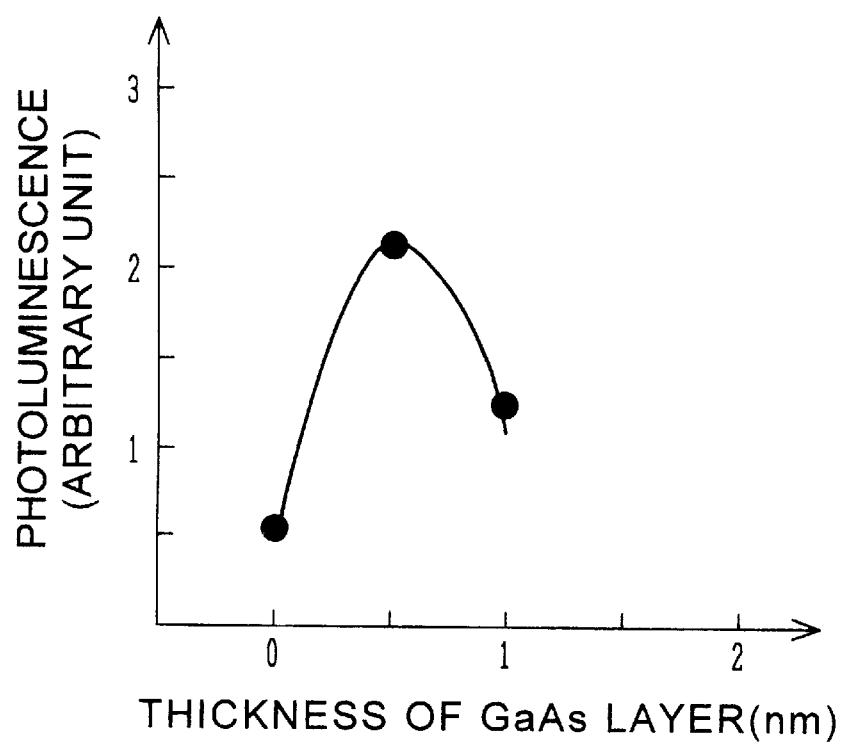

FIGS. 8A and 8B show the structure of samples and the measurement results. FIG. 8A schematically shows the structure of samples. The structure of a substrate 1, a buffer layer 2, and an InGaP intermediate layer 3 is the same as the above-described embodiment. The InGaP intermediate layer 3 functions also as the clad layer, and a multiple well structure of a strained InGaAs well layer and an AlGaInAs barrier layer is formed on the intermediate layer 3. Specifically, an $Al_{0.2}Ga_{0.5}In_{0.6}As$ light confining layer 4b is formed to a thickness of about 100 nm and an $In_{0.4}Ga_{0.6}As$ strained well layer 6a is formed to a thickness of about 7 nm, with a GaAs layer 16a being interposed therebetween. Further, an $Al_{0.2}Ga_{0.5}In_{0.3}As$ barrier layer 6b is formed to a thickness of 10 nm with a GaAs layer 16b being interposed between the layers 6a and 6b. Still further, a GaAs layer 16c, a strained well layer 6a, and a GaAs layer 16d having the same structure as above are grown and an $Al_{0.2}Ga_{0.5}In_{0.3}As$ light confining layer 7a is formed to a thickness of about 100 nm. On this light confining layer 7a, an $In_{0.6}Ga_{0.2}P$ clad layer 8b is formed to a thickness of about 1000 nm.

By using the sample structure shown in FIG. 8A, the photoluminescence intensity from the strained well layers 6a was measured as a function of the thickness of a GaAs layer 16 (the GaAs layers 16a to 16d are collectively called hereinunder the GaAs layer 16).

FIG. 8B is a graph showing the measurement results. The abscissa represents a thickness of the GaAs layer 16 in nm and the ordinate represents a photoluminescence intensity in an arbitrary unit. If the GaAs layer is not inserted, the photoluminescence intensity is extremely weak. If the GaAs layer of 0.5 nm thick is inserted, the photoluminescence intensity becomes considerably strong. If the GaAs layer of 1 nm thick is inserted, the photoluminescence intensity lowers greatly. It can be considered from the measurement results that the thickness of the GaAs layer inserted between the strained well layer and barrier layer (light confining layer) is preferably 0.2 to 1 nm, or more preferably 0.4 to 0.8 nm.

Figure 9:
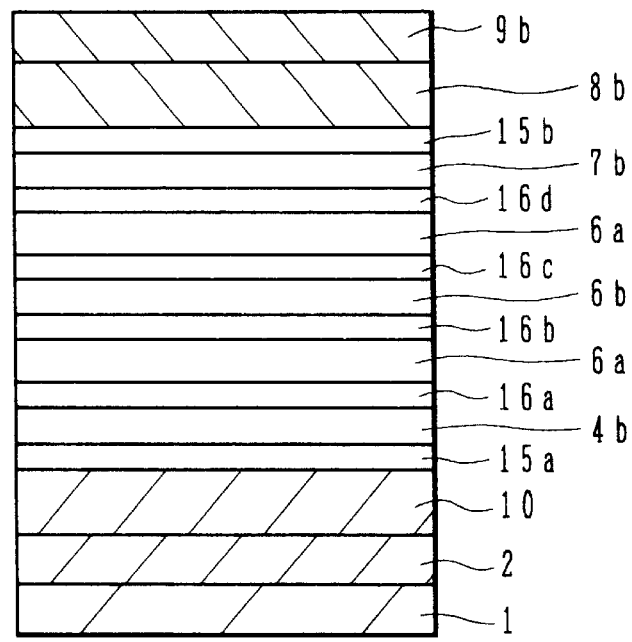
FIG. 9 is a cross sectional view showing the structure of a semiconductor laser according to a still further embodiment of the invention.

FIG. 9 shows the lamination structure of a semiconductor laser formed by utilizing the measurement results illustrated in FIGS. 7A and 7B and FIGS. 8A and 8B.

The structure of a substrate, a buffer layer 2, and an intermediate/clad layer 10 is the same as the embodiment shown in FIG. 4. On the intermediate/clad layer 10, a light confining layer 4b of 100 nm thick is formed with a GaAs layer 15a being interposed therebetween.

Over the light confining layer 4b, two strained well layers 6a sandwiching a barrier layer 6b are disposed, and over the upper strained well layer 6a a light confining layer 7b of 100 nm thick is disposed. GaAs layers 16a to 16d of 0.5 nm are inserted between adjacent ones of the above-described layers. The light confining layers 4b and 7b and barrier layer 6b are made of non-doped $Al_{0.2}Ga_{0.5}In_{0.3}As$, and the strained well layers are made of non-doped $In_{0.4}Ga_{0.6}As$.

On the light confining layer 7b, a p-type clad layer 8b and a $p^+$-type contact layer 9 are formed with a GaAs layer 15b being interposed therebetween. The p-type clad layer 8b is made of p-type $In_{0.8}Ga_{0.2}P$ and 1 μm thick, and the $p^+$-type contact layer 9 is made of $In_{0.3}Ga_{0.7}As$ and 500 nm thick.

The carrier concentration of the clad layer and buffer layer is basically set to about $1\times10^{15} cm^{-3}$ and that of the contact layer is $2\times10^{19} cm^{-3}$ or higher. The impurity concentration of the intermediate/clad layer is set to about $1\times 10^{19} cm^{-3}$ from the viewpoint of crystallinity although it may be set to about $1\times10^{19}$ $cm^{-3}$ from the electrical viewpoint.

In the above description, although two strained well layers are used for the active layer, the actual number of well layers is in the range from 2 to 7 or preferably 5. The strain amount of the well layer is 0.5 to 1.5%. Although it is preferable that the strain amount is large, the maximum strain amount is determined from a tradeoff between strain and crystallinity, and it is set to about 1% for example.

In this embodiment, similar to the embodiment shown in FIG. 4, the InGaP layer 10 functions as both the intermediate layer and n-type clad layer. A GaAs layer is inserted at each heterojunction between layers from the intermediate/clad layer 10 to clad layer 8b so that degrading of crystallinity at the heterojunction can be prevented and good crystallinity is ensured.

Figure 10:
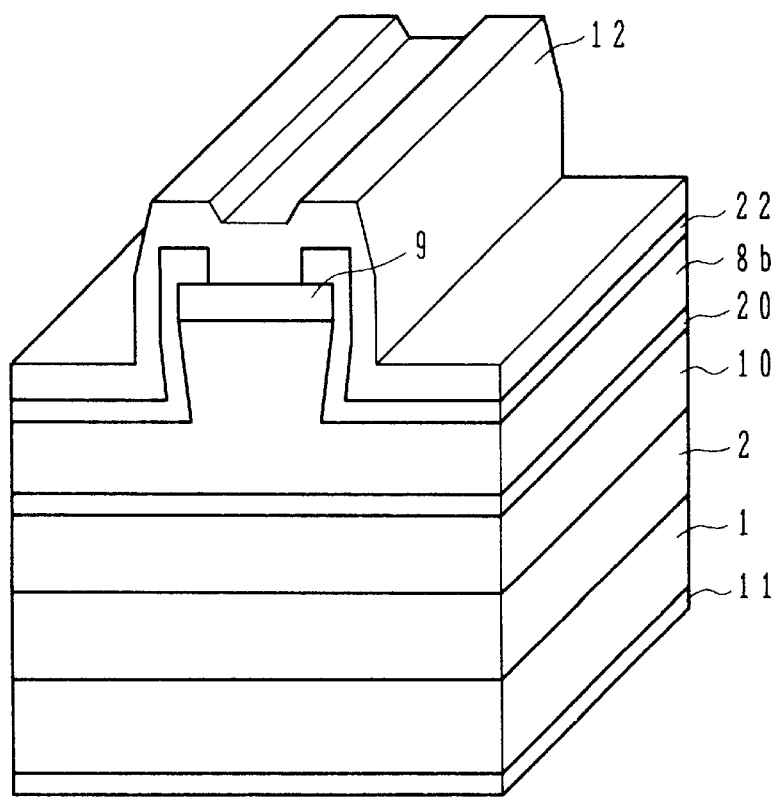
FIG. 10 is a perspective view of a ridge waveguide type laser structure formed by the laminate structure shown in FIG. 9.

FIG. 10 shows a ridge waveguide type laser utilizing the laser wafer shown in FIG. 9. A lamination from the intermediate/clad layer 10 to the p-type clad layer 8b is generally indicated at 20. The contact layer 9 and the clad layer 8b are etched from the surface of the contact layer 9 to the intermediate depth of the clad layer 8b, with the central stripe region being left unetched. The side wall of the stripe region and the lower flat surface of the clad layer 8b are covered with an insulating protection layer 22 such as an oxide film. An n-side electrode 11 is formed on the bottom surface of the substrate 1, and a p-side electrode 12 is formed on the top surface of the contact layer 9, both the electrodes forming ohmic contact. Opposite ends of the ridge are cleaved to form a resonator having a length of about 900 μm. The width of the ridge is about 5 μm. With this structure of the laser, a threshold current of 20 mA and the characteristic temperature of 110 K were obtained.

In the lamination structure shown in FIG. 9, the intermediate layer for transforming a surface morphology and the clad layer are formed by a single InGaP layer. The intermediate layer for transforming the surface morphology from the cross hatched step pattern to the stripe step pattern may be formed separately from the clad layer which provides the light confinement effects.

FIGS. 11 to 14 show other embodiments in which an intermediate layer and a clad layer are made of different layers.

Figure 11:
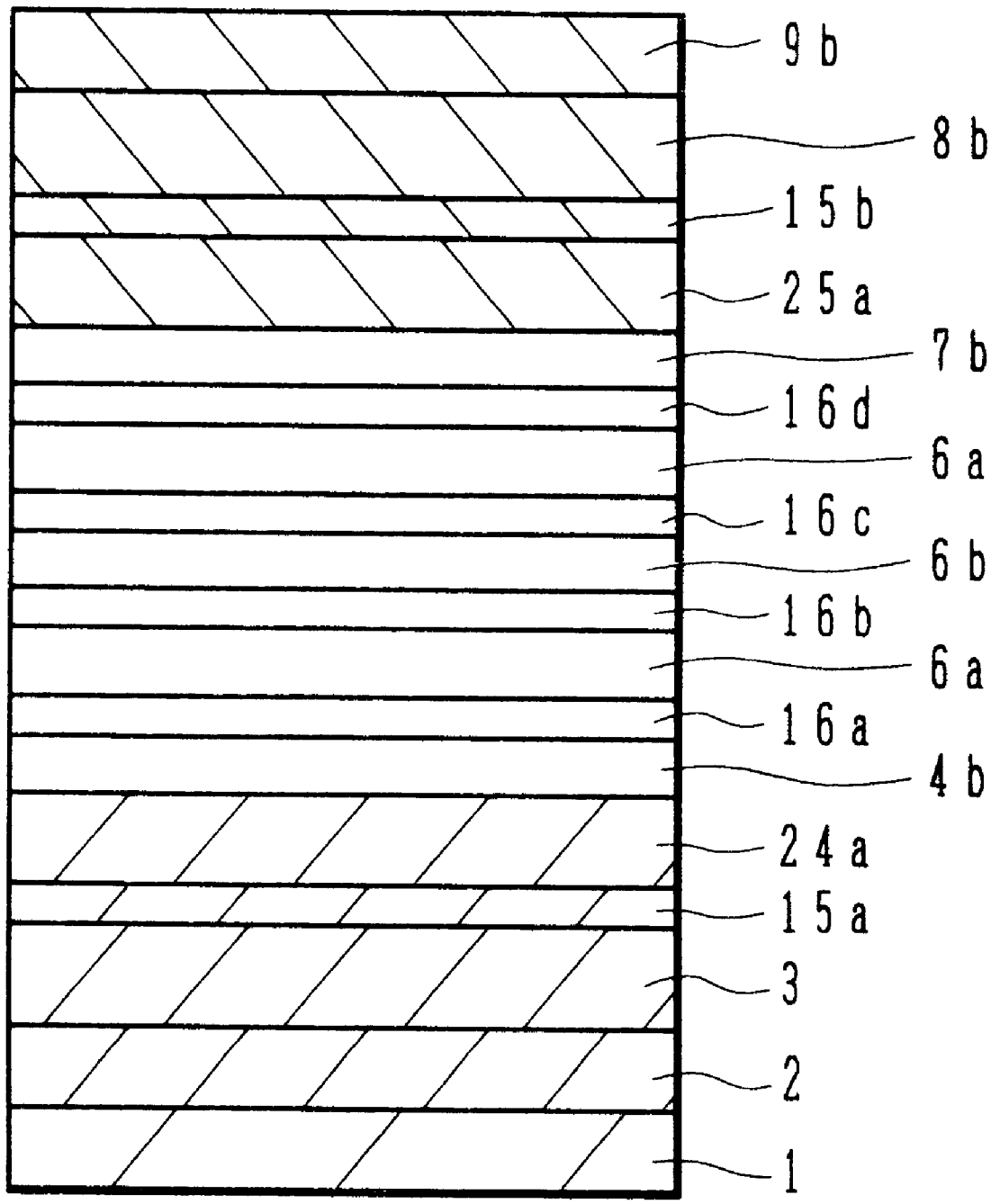
FIGS. 11 to 14 are cross sectional views showing the structures of semiconductor lasers according to other embodiments of the invention.

In the embodiment shown in FIG. 11, on a buffer layer 2, an intermediate layer 3 is formed which is made of n-type $In_{0.8}Ga_{0.2}P$ and is about 1 μm thick. On this intermediate layer 3, an n-type GaAs layer 15a of about 1.0 nm thick and a clad layer 24a made of n-type $Al_{0.7}In_{0.3}As$ and having a thickness of about 200 nm are stacked.

A p-type clad layer 25a made of $Al_{0.7}In_{0.3}As$ and having a thickness of about 200 nm is formed on an upper light confining layer 7b of $Al_{0.2}Ga_{0.5}In_{0.3}As$. The other structures are the same as the embodiment shown in FIG. 9.

Since the $Al_{0.7}In_{0.3}As$ clad layer having a wider forbidden band than $In_{0.8}Ga_{0.2}P$ and a thickness of about 200 nm is formed outside of the strain well layer, barrier layer, and light confining layer, the light confinement factor can be efficiently improved.

Figure 12:
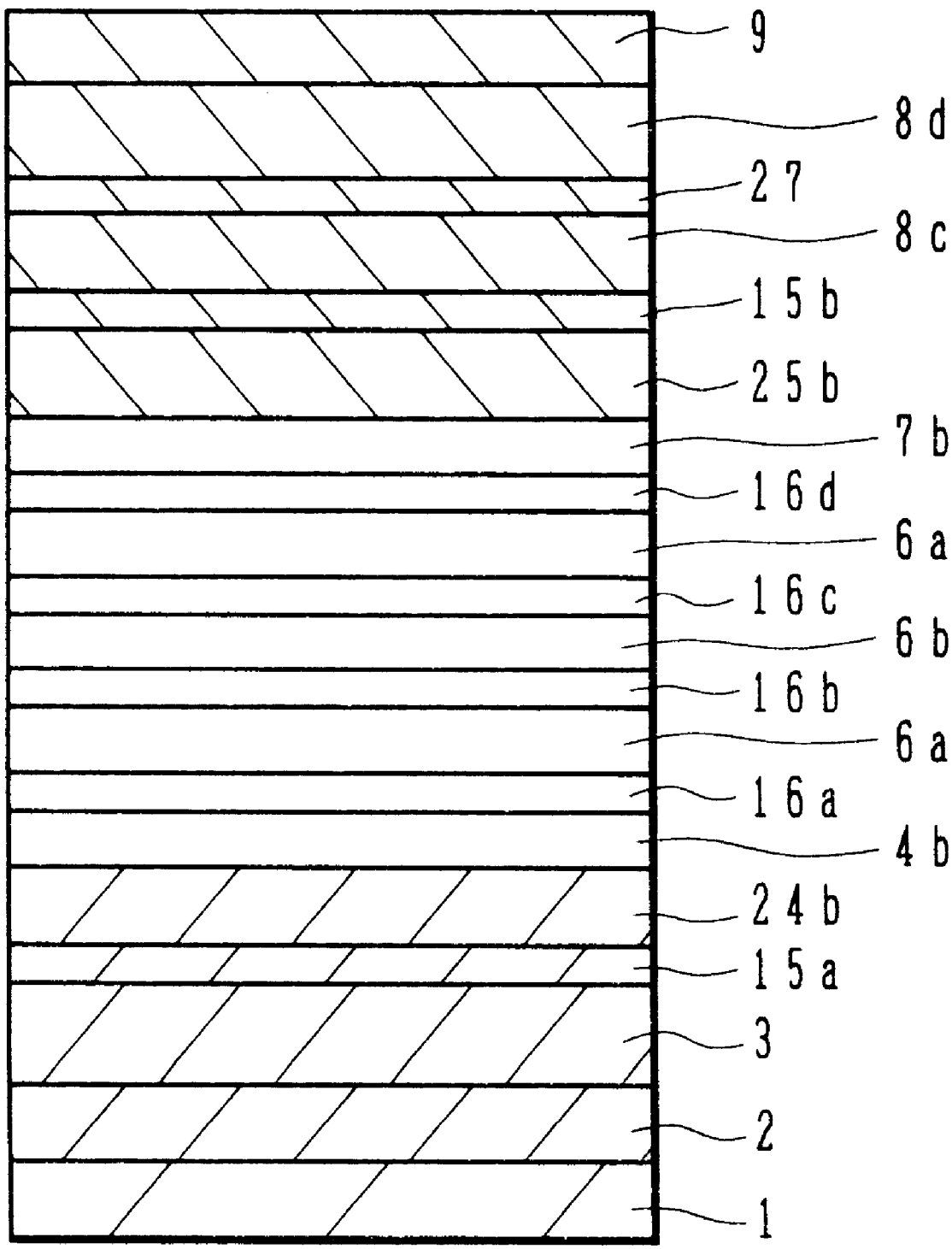

The structure shown in FIG. 12 has an etch stopper layer at the intermediate depth of the p-type clad layer. On a p-type lower clad layer 8c made of p-type $In_{0.8}Ga_{0.2}P$ and having a thickness of about 100 nm, an etch stopper layer 27 is formed which is made of p-type $In_{0.3}Ga_{0.7}As$ and is about 10 nm thick. Formed on this etch stopper layer 27 is a p-type upper clad layer 8d made of p-type $In_{0.8}Ga_{0.2}P$ and having a thickness of about 1000 nm.

As the $In_{0.8}Ga_{0.2}P$ upper clad layer 8d is etched from the surface thereof by hydrogen chloride acid or hydrogen bromide acid, the $In_{0.3}Ga_{0.7}P$ etch stopper layer is not etched and the etching is automatically stopped at this etch stopper layer. With this structure, the process control of wet etching for forming a ridge waveguide can be made easy.

In this embodiment, the clad layers 24b and 25b are made of $Al_{0.5}Ga_{0.2}In_{0.3}As$ having an Al composition smaller than that shown in FIG. 11. Such clad layers make high quality crystal growth and doping easy, although the light confinement factor is lowered somewhat. The other structures are the same as those shown in FIG. 11.

Figure 13:
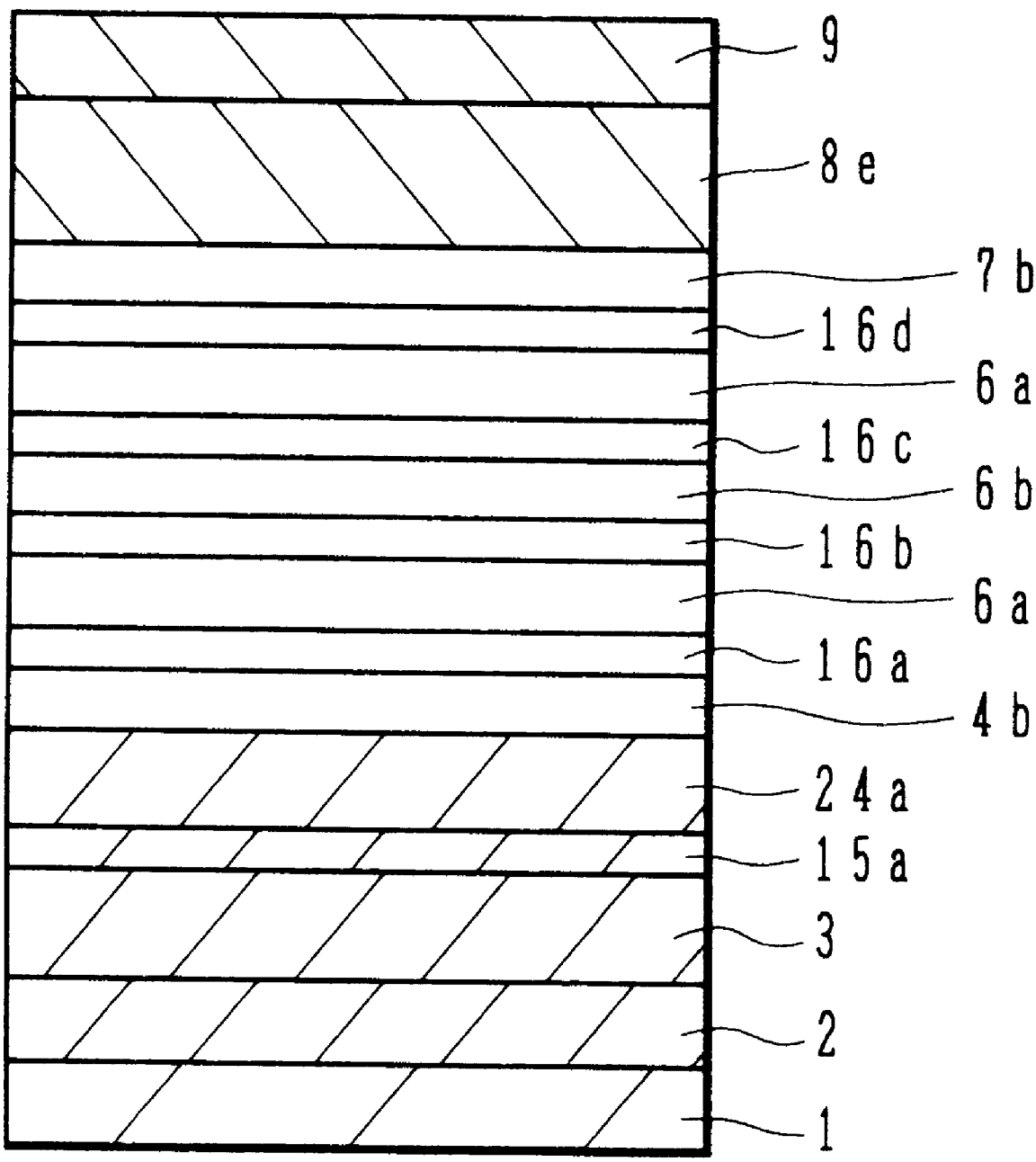

The structure shown in FIG. 13 has a p-type clad layer 8e formed by a single layer of p-type $Al_{0.4}Ga_{0.3}In_{0.3}As$ and having a thickness of 1 m. The discontinuity of the band structure with the p-type contact layer 9 made of $In_{0.3}Ga_{0.7}As$ can be reduced and a series resistance can be efficiently lowered. This resistance can be more efficiently lowered if an AlGaInAs layer having a composition intermediate between those of the $Al_{0.4}Ga_{0.3}In_{0.3}As$ layer 8e and $In_{0.3}Ga_{0.7}As$ contact layer 9, is inserted between the two layers 8e and 9. If an etch stopper layer is to be inserted into this clad layer, an InGaP layer may be used. In this case, etchant may be a mixed solution of aqua ammonia and hydrogen peroxide.

Figure 14:
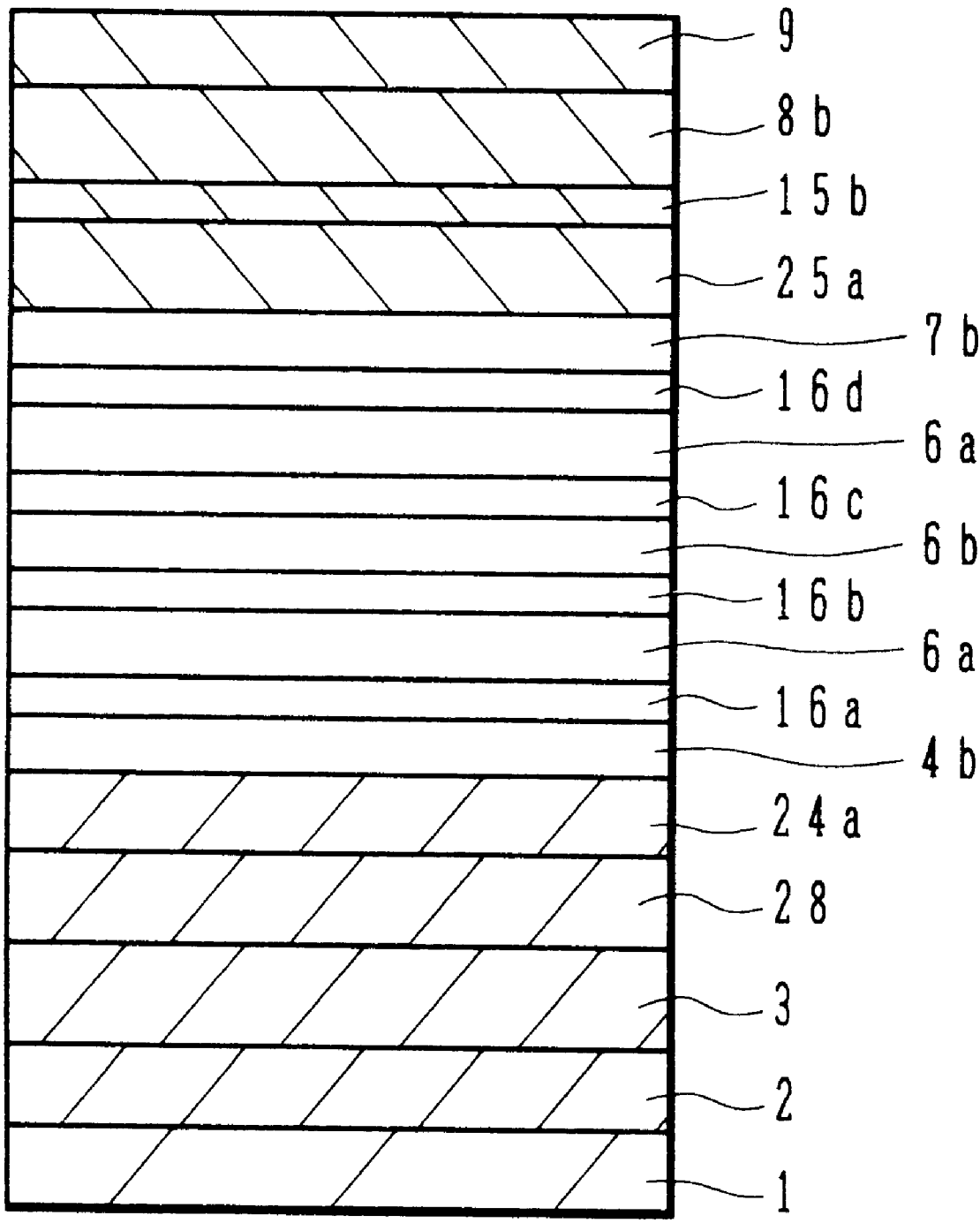

In the structure shown in FIG. 14, on an intermediate layer 3, a planarizing layer 28 is formed which is made of n-type $In_{0.3}Ga_{0.7}As$ and having a thickness of about 500 nm. The surface of this planarizing layer 28 becomes generally flat. On the planarizing layer 28, a clad layer 24a is formed which is made of n-type $Al_{0.7}In_{0.3}As$ and having a thickness of about 1 μm. Similar to the structure shown in FIG. 11, over the clad layer 24a, light confining layers, quantum well layers, a barrier layer, a clad layer, and a contact layer are formed.

Since the InGaAs planarizing layer 28 is formed on the InGaP intermediate layer 3, the layers grown above the flat surface of the planarizing layer can be made flat.

The present invention has been described in connection with the preferred embodiments. The invention is not limited only to the above embodiments. It is apparent to those skilled in the art that various modifications, improvements, combinations and the like can be made within the scope and spirit of the present invention.

I claim:

1. A semiconductor laser comprising:
   a substrate of group III-V semiconductor having a first lattice constant and a primary surface;
   a clad layer of group III-V semiconductor disposed on said primary surface and having a second lattice constant different from said first lattice constant by 0.5% or more;
   a light propagation layer of group III-V semiconductor disposed on said clad layer, said light propagation layer including an active layer and light confining layers disposed on both sides of said active layer, said light confining layers containing Al as a group III element and having a refractive index lower than said active layer;
   a buffer layer of group III-V semiconductor disposed between said primary surface and said clad layer, said buffer layer including a composition graded layer gradually changing a lattice constant in the range between said first and second lattice constants, and having a cross hatched step on the surface thereof; and
   an intermediate layer of group III-V semiconductor disposed between said buffer layer and said clad layer, said intermediate layer containing phosphorous as a group V element.

2. A semiconductor laser according to claim 1, wherein said intermediate layer has a cross hatched step at a lower surface and a stripe step at an upper surface.

3. A semiconductor laser according to claim 1, wherein said composition graded layer has a composition continuously changing in a depth direction.

4. A semiconductor laser according to claim 1, wherein said composition graded layer has a composition stepwisely changing in a depth direction.

5. A semiconductor laser according to claim 1, wherein the group III-V semiconductor of said clad layer contains Al as a group III element.

6. A semiconductor laser according to claim 5, wherein the group III-V semiconductor of said clad layer is AlGaInAs or AlInAs.

7. A semiconductor laser according to claim 1, wherein said intermediate layer, said clad layer, and one of said light confining layers are directly laminated together.

8. A semiconductor laser according to claim 1, wherein said intermediate layer and said clad layer are formed by a single common layer.

9. A semiconductor laser according to claim 1, wherein the group III-V semiconductor of said light confining layer is AlGaInAs.

10. A semiconductor laser according to claim 1, wherein the group III-V semiconductor of said intermediate layer is InGaP.

11. A semiconductor laser according to claim 1, further comprising a planarizing layer of group III-V semiconductor disposed between said intermediate layer and said clad layer, said planarizing layer having a phosphorous composition as a group V element which is smaller than a phosphorous composition of the group III-V semiconductor of said intermediate layer and having an Al composition as a group III element which is smaller than an Al composition of the group III-V semiconductor of said clad layer.

12. A semiconductor laser according to claim 11, wherein the group III-V semiconductor of said planarizing layer is InGaAs.

13. A semiconductor laser according to claim 1, wherein said intermediate layer, said clad layer, and said light confining layer include a layer containing phosphorous as a group V element and a layer containing Al as a group III element, and the semiconductor laser further comprises a GaAs layer disposed between said phosphorous containing layer and said Al containing layer.

14. A semiconductor laser according to claim 13, wherein said Al containing layer is AlGaInAs or AlInAs and said phosphorous containing layer is InGaP.

15. A semiconductor laser according to claim 13, wherein said GaAs layer has a thickness in a range from 0.5 nm exclusive to 2.0 nm inclusive.

16. A semiconductor laser according to claim 1, wherein said light propagation layer includes an InGaAs layer, an AlGaInAs layer, and a GaAs layer interposed between the InGaAs and AlGaInAs layers.

17. A semiconductor laser according to claim 16, wherein said GaAs layer has a thickness in a range from 0.2 to 1.0 nm.

18. A semiconductor laser according to claim 17, wherein said GaAs layer has a thickness in a range from 0.4 to 0.8 nm.

19. A semiconductor laser comprising:
    a substrate of group III-V semiconductor having a first lattice constant and a primary surface;
    a clad layer of group III-V semiconductor disposed on said primary surface and having a second lattice constant different from said first lattice constant by 0.5% or more, said clad layer containing Al as a group III element;
    a light propagation layer of group III-V semiconductor disposed on said clad layer, said light propagation layer including an active layer and light confining layers disposed on both sides of said active layer, said light confining layers containing Al as a group III element and having a refractive index lower than said active layer;

a buffer layer of group III-V semiconductor disposed between said primary surface and said clad layer, said buffer layer including a composition graded layer gradually changing a lattice constant in the range between said first and second lattice constants, and having a cross hatched step on the surface thereof;

an intermediate layer of group III-V semiconductor disposed between said buffer layer and said clad layer, said intermediate layer containing phosphorous as a group V element; and a planarizing layer of group III-V semiconductor disposed between said intermediate layer and said clad layer, said planarizing layer having a phosphorous composition as the group V element smaller than the phosphorous composition of the group III-V semiconductor of said intermediate layer and having an Al composition as a group III element smaller than the Al composition of the group III-V semiconductor of said clad layer.

20. A semiconductor laser according to claim 19, wherein the phosphorous composition of said planarizing layer is 0.5 or smaller.

21. A semiconductor laser according to claim 19, wherein the Al composition of said clad layer is larger than 0.2.

22. A semiconductor laser according to claim 19, wherein said intermediate layer has a cross hatched step at a lower surface and a stripe step at an upper surface.

23. A semiconductor laser according to claim 19, wherein said composition graded layer has a composition continuously changing in a depth direction.

24. A semiconductor laser according to claim 19, wherein the group III-V semiconductor of said intermediate layer is InGaP.

25. A semiconductor laser according to claim 19, wherein the group III-V semiconductor of said planarizing layer is InGaAs.

26. A semiconductor laser according to claim 19, wherein the group III-V semiconductor of said clad layer is AlGaInAs or AlInAs.

* * * * *